(12) United States Patent
D'Aquino et al.

(10) Patent No.: US 8,766,725 B2
(45) Date of Patent: Jul. 1, 2014

(54) APPARATUS AND METHODS FOR FREQUENCY COMPENSATION OF AN AMPLIFIER

(75) Inventors: Stefano I. D'Aquino, Westford, MA (US); Kimo Tam, Lincoln, MA (US); Yukihisa Handa, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 99 days.

(21) Appl. No.: 13/446,773

(22) Filed: Apr. 13, 2012

(65) Prior Publication Data

US 2013/0271219 A1 Oct. 17, 2013

(51) Int. Cl.
*H03F 1/34* (2006.01)
(52) U.S. Cl.
USPC ............................................ 330/291; 330/98
(58) Field of Classification Search
USPC .......................................... 330/252–261, 292
See application file for complete search history.

(56) References Cited

U.S. PATENT DOCUMENTS

| 5,877,654 | A | 3/1999 | Fong et al. |
| 7,310,016 | B2 | 12/2007 | Chuang |
| 8,395,448 | B2 * | 3/2013 | Ivanov et al. ................. 330/292 |
| 2003/0137351 | A1 | 7/2003 | Renous et al. |
| 2006/0261860 | A1 | 11/2006 | Yamada |

FOREIGN PATENT DOCUMENTS

| FR | 2 833 430 | 6/2003 |
| WO | WO 02/01711 A1 | 1/2002 |

OTHER PUBLICATIONS

Bajoria S. et al., *Low Power High Bandwidth Amplifier with RC Miller and Gain Enhanced Feedforward Compensation*, 2008 ACM/IEEE International Symposium on Low Power Electronics and Design, IEEE, Aug. 11, 2008, pp. 193-196.
Bult, Klaas, and Geelen, Govert J.G.M., "A Fast-Settling CMOS Op Amp for SC Circuits with 90 dB DC Gain," IEEE Journal of Solid-State Circuits, Vo.. 25, No. 6, Dec. 1990.
Gulati, Kush and Lee, Hae Seung, "A High-Swing CMOS Telescopic Operational Amplifier," IEEE Journal of Solid-State Circuits, vol. 33, No. 12, Dec. 1998.
Huijsing, Johan H., "Low-Power Low-Voltage VLSI Operational Amplifier Cells," IEEE Transactions on Circuits and Systems-I: Fundamental Theory and Applications, vol. 42, No. 11, Nov. 1995.
Perlin, Gayatri E., Sodagar, Amir M., Wise, Kensall D., "A Neural Amplifier with High Programmable Gain and Tunable Bandwidth," 30th Annual International IEEE EMBS Conference Vancouver, British Columbia, Canada, Aug. 20-24, 2008.
Razavi, Behzad, "Design of Analog CMOS Integrated Circuits," Stability and Frequency Compensation Chap. 10, pp. 361-364, 2001.
Thandri, Bharath Kumar and Silva-Martinez, Jose, "An overview of feed-forward design techniques for high-gain wideband operational transconductance amplifiers," Microelectronics Journal 37 1018-1029, Apr. 19, 2006.

* cited by examiner

*Primary Examiner* — Hieu Nguyen
(74) *Attorney, Agent, or Firm* — Knobbe, Martens, Olson & Bear, LLP (57) ABSTRACT

Apparatus and methods for frequency compensation of an amplifier are provided. In one embodiment, an integrated circuit (IC) includes an amplifier configured to amplify an input signal to generate an output signal. The IC further includes an output pad configured to receive an output signal from the amplifier and a control pad for controlling the closed-loop bandwidth of the amplifier. A compensation capacitor is electrically connected between an input of the inverting amplification block and an output of the inverting amplification block, and a switchable capacitor is electrically connected between the input of the inverting amplification block and the control pad. The control pad can be electrically connected to a DC voltage source or to the output pad to control the amplifier's closed-loop bandwidth.

16 Claims, 7 Drawing Sheets

APPARATUS AND METHODS FOR FREQUENCY COMPENSATION OF AN AMPLIFIER

BACKGROUND

1. Field

Embodiments of the invention relate to electronic devices, and more particularly, to amplifiers.

2. Description of the Related Technology

An amplifier can be included in an electronic system to amplify signals for transmission to an external device or for further processing within the system. The amplifier can receive an input signal and amplify the input signal to generate an output signal. To aid in improving the amplifier's overall performance, the amplifier can include multiple amplification stages. For example, the amplifier can include amplification stages cascaded to achieve a desired overall gain of the amplifier.

Certain electronic systems use an amplifier in a closed-loop configuration. For example, an output of the amplifier can be electrically connected to an input of the amplifier to provide feedback. Connecting an amplifier in a feedback configuration can help improve gain stability, linearity, and/or other performance parameters of the amplifier relative to a configuration in which the amplifier is used open-loop.

There is a need for amplifiers having improved performance. Furthermore, there is a need for amplifiers having improved performance in closed-loop implementations.

SUMMARY

In one embodiment, an integrated circuit (IC) includes an amplifier configured to amplify an input signal to generate an output signal. The amplifier includes a first inverting amplification block, a first compensation capacitor electrically connected between an input of the first inverting amplification block and an output of the first inverting amplification block, an output pad configured to receive the output signal from the amplifier, and a control pad configured to control a closed loop bandwidth of the amplifier. The control pad is separate from the input of the first inverting amplification block. The IC further includes a first switchable capacitor electrically connected between the input of the first inverting amplification block and the control pad. The first switchable capacitor is an explicit capacitor.

In another embodiment, an amplifier includes an inverting amplification block, a compensation capacitor including a first end connected to an input of the inverting amplification block and a second end electrically connected to an output of the inverting amplification block, and a switchable capacitor including a first end electrically connected to the input of the inverting amplification block and a second end. The switchable capacitor is an explicit capacitor. The amplifier further includes a plurality of switches electrically connected to the second end of the switchable capacitor and a switch control block configured to control the plurality of switches based on a control signal. The switch control block is configured to electrically connect the second end of the switchable capacitor to a DC voltage source when the control signal is in a first state and to electrically connect the second end of the switchable capacitor to an output of the inverting amplification block when the control signal is in a second state.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Electronic Systems Including Amplifiers

Electronic systems including an amplifier for amplifying an input signal to generate an output signal are provided. In certain implementations, the amplifier is configured such that the closed-loop gain of the amplifier can be changed while maintaining the closed-loop bandwidth of the amplifier substantially constant. For example, the amplifier can include a pin or pad that can be connected in different ways so as to maintain the amplifier's closed-loop bandwidth substantially constant across configurations of the amplifier having different closed-loop gain. By providing an amplifier that can be controlled in this manner, the amplifier can be used in applications utilizing different closed-loop gains, while avoiding a need to manufacture multiple amplifier variations suitable for use with a particular closed-loop gain.

Figure 1A:
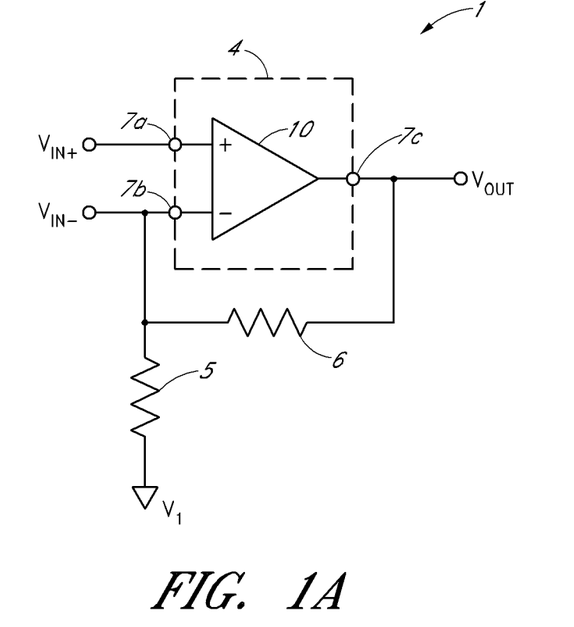
FIGS. 1A and 1B are circuit diagrams of two examples of electronic systems.
Figure 1B:
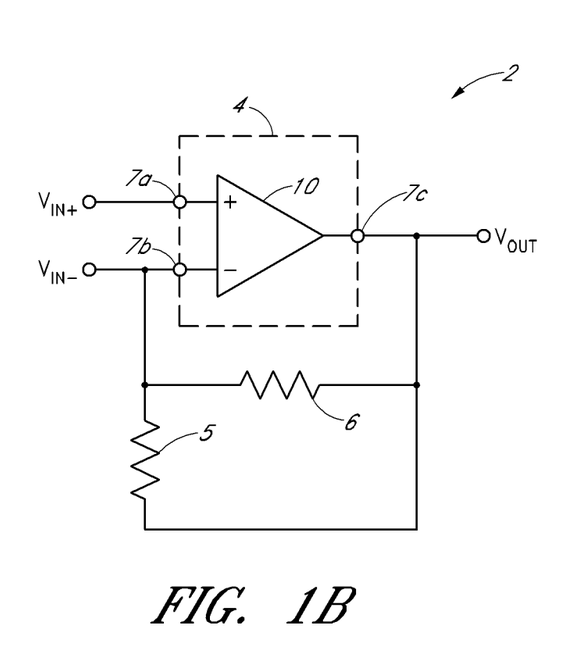

FIGS. 1A and 1B are circuit diagrams of two examples of electronic systems.

FIG. 1A is a circuit diagram of a first electronic system 1 including an integrated circuit (IC) 4, a first resistor 5, and a second resistor 6. The IC 4 includes an amplifier 10, a first pad 7a configured to receive a non-inverted or positive input voltage signal $V_{IN+}$, a second pad 7b configured to receive an inverted or negative input voltage signal $V_{IN-}$, and a third pad 7c configured to generate an output voltage signal $V_{OUT}$. The first resistor 5 includes a first end electrically connected to a first end of the second resistor 6 and to the second pad 7b of the IC 4. The first resistor 5 further includes a second end electrically connected to a first voltage $V_1$, which can be, for example, any suitable DC voltage source, such as a power-low supply, a power-high supply, or a reference voltage. The second resistor 6 further includes a second end electrically connected to the third pad 7c of the IC 4.

FIG. 1B is a circuit diagram of a second electronic system 2 including the IC 4, the first resistor 5, and the second resistor 6. The IC 4 includes the amplifier 10 and the first to third pads 7a-7c, which can be as described above with respect to FIG. 1A. The first resistor 5 includes a first end electrically connected to the second pad 7b of the IC 4 and to a first end of the second resistor 6. The first resistor 5 further includes a second end electrically connected to a second end of the second resistor 6 and to the third pad 7c.

The first and second electronic systems 1, 2 each include the amplifier 10. The amplifier 10 can be used to amplify a differential input voltage signal to generate an amplified output voltage signal. For example, the amplifier 10 includes a first or non-inverted input configured to receive the non-inverted input voltage signal $V_{IN+}$ from the first pad 7a, a second or inverted input configured to receive the inverted input voltage signal $V_{IN-}$ from the second pad 7b, and an output configured to generate the output voltage signal $V_{OUT}$ on the third pad 7c. The amplifier 10 can have relatively high values of open-loop gain, for example, an open-loop gain greater than about 60 dB. However, skilled artisans will readily determine other suitable gain values.

Although the amplifier 10 can have a relatively large open-loop gain, the amplifier 10 can be connected in different feedback configurations to achieve a closed-loop gain desirable for a particular electronic system or application. For example, the first electronic system 1 of FIG. 1A has been implemented in a first feedback configuration in which the closed-loop gain of the amplifier 10 can be equal to about $1+R_2/R_1$, where $R_2$ is about equal to the resistance of the second resistor 6 and $R_1$ is about equal to the resistance of the first resistor 5. Additionally, the second electronic system 2 of FIG. 1B has been implemented in a second feedback configuration in which the first and second resistors 5, 6 have been electrically connected in parallel such that the closed-loop gain of the amplifier 10 can be equal to about 1. In certain configurations, the first resistor 5 can be considered a switchable resistor whose connectivity can be changed to control the closed-loop gain of the amplifier 10. In other implementations, the first and second resistors 5, 6 can be replaced with a single resistor of equivalent resistance when the amplifier 10 is used in the configuration illustrated in FIG. 1B.

Certain electronic systems can use amplifiers having different closed-loop gains. For example, the amplifier 10 can be used in an electronic system that receives or transmits electronic signals over a category-5 (Cat-5) unshielded twisted-pair (UTP) cable, which can be used, for example, in keyboard-video-mouse (KVM) networking and high-definition television (HDTV) applications. When using the amplifier 10 to transmit signals over a Cat-5 cable, the amplifier 10 can be configured to have a closed-loop gain of, for example, about 1. However, when the amplifier 10 is used to receive signals transmitted over a Cat-5 cable, the amplifier 10 can be configured to have a closed-loop gain of, for example, 2 or more to compensate for signal losses associated with back termination. In order to reduce manufacturing cost, it can be desirable to use amplifiers fabricated using the same mask set to provide both transmit and receive functions. Accordingly, it can be desirable to use an amplifier in configurations associated with different closed-loop gains. Although one example of an electronic system suitable for using the amplifier 10 has been described above, the amplifier 10 can be used in a wide variety of electronic systems and applications.

Although the amplifier 10 can be connected in various configurations to control the amplifier's closed-loop gain, the closed-loop bandwidth of the amplifier can be different for each configuration absent a frequency compensation scheme. For example, in certain implementations, the closed-loop bandwidth can be equal to the frequency at which $A(s)/G_{CL}$ drops to unity, where $A(s)$ is the open-loop voltage transfer function of the amplifier 10 and $G_{CL}$ is the closed-loop gain. Accordingly, when the open-loop voltage transfer function $A(s)$ of the amplifier 10 is the same for the first and second electronic systems 1, 2, in certain implementations the closed-loop bandwidth of the electronic system 2 of FIG. 1B can be a factor of about $1+R_2/R_1$ times larger than a closed-loop bandwidth of the electronic system 1 of FIG. 1A. As used herein, the voltage transfer function of an amplifier can refer to a mathematical representation, in terms of temporal frequency, of the relation between the input voltage and the output voltage of the amplifier.

Using an amplifier that has a closed-loop bandwidth that depends on the closed-loop gain can be undesirable from a performance standpoint. For example, when the closed-loop bandwidth of the amplifier 10 changes based on closed-loop gain of the amplifier 10, the amplifier 10 may exhibit undesirable oscillations in certain feedback configurations.

The value of a compensation capacitor of the amplifier 10 can be controlled to achieve a desired closed-loop bandwidth for a given closed-loop gain. For example, the capacitance of the amplifier's compensation capacitor can determine a frequency of the dominant pole in the open-loop voltage transfer function $A(s)$ of the amplifier 10. Since the gain of an amplifier can decrease or fall off at frequencies greater than the frequency of the dominant pole, the compensation capacitor of the amplifier 10 can be used to control the amplifier's closed-loop bandwidth by changing the unity gain crossover frequency or the frequency at which $A(s)/G_{CL}$ reaches unity for a given closed-loop gain $G_{CL}$. As used herein, dominant pole can refer to a pole in the frequency domain that masks the effects of other poles of a transfer function.

One way to adjust the capacitance of a compensation capacitor of the amplifier 10 is to change a metal mask used to fabricate the IC 4. For example, a plurality of capacitive segments or elements can be fabricated on the IC 4, and the number of capacitive segments that collectively operate as the compensation capacitor can be selected using the metal mask. Alternatively, at least part of one of the plates of the compensation capacitor can be formed from a metal layer of the IC 4, and the area of the plate can be adjusted by changing the metal mask. Although amplifiers with different closed-loop bandwidths can be generated using different masks, such a solution may not be cost effective since it can involve generating variations of the amplifier 10 suitable for use with a particular closed-loop gain value.

Frequency compensation schemes are provided herein in which an amplifier's closed-loop bandwidth is substantially independent of the amplifier's closed-loop gain. Furthermore, in certain implementations, independence between closed-loop bandwidth and closed-loop gain can be achieved without requiring switches, additional chip area, metal mask changes, and/or extra power.

Figure 2A:
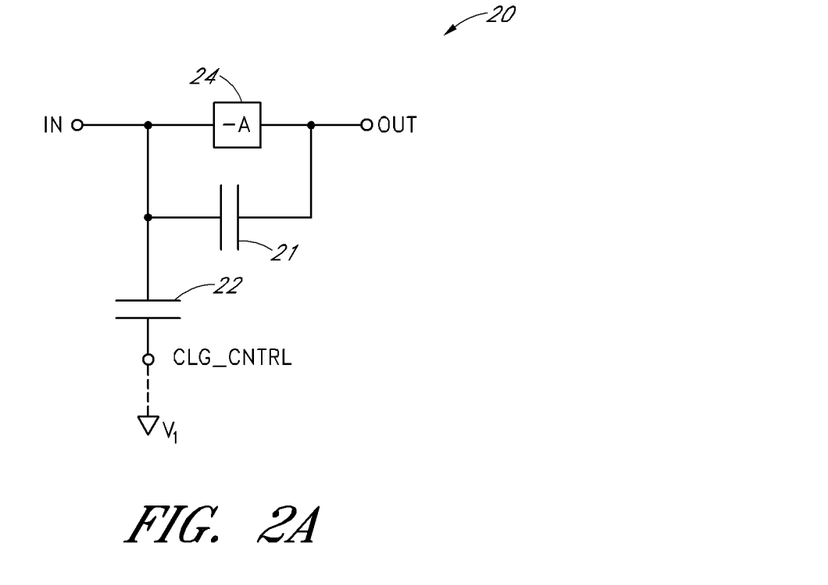
FIGS. 2A and 2B are circuit diagrams of one embodiment of an amplification stage of an amplifier.
Figure 2B:
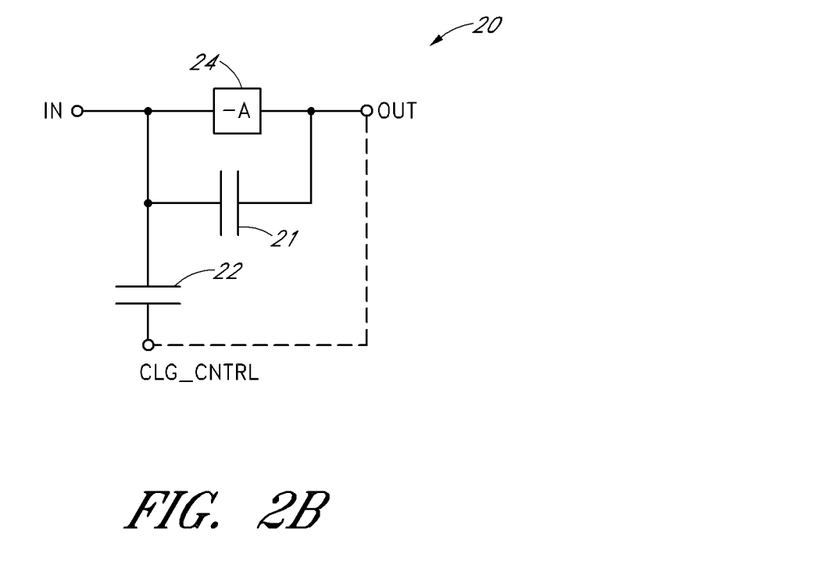

FIGS. 2A and 2B are circuit diagrams of one embodiment of an amplification stage 20 of an amplifier. The amplification stage 20 includes an input terminal IN, an output terminal OUT, and a closed-loop gain control terminal CLG_CNTRL. The amplification stage 20 further includes a first or compensation capacitor 21, a second or switchable capacitor 22, and an inverting amplification block 24. The compensation capacitor 21 and the switchable capacitor 22 correspond to explicit capacitors and not merely to parasitic capacitance; however, parasitic capacitance can be included in a total capacitance represented by the capacitors 21, 22.

The amplification stage 20 includes an input electrically connected to input terminal IN and an output electrically connected to the output terminal OUT. The compensation capacitor 21 includes a first end electrically connected to the input terminal IN and a second end electrically connected to the output terminal OUT. The switchable capacitor 22 includes a first end electrically connected to the input terminal IN and a second end electrically connected to the closed-loop gain control terminal CLG_CNTRL. In certain implementations, the closed-loop gain control terminal CLG_CNTRL is electrically connected to a pin or pad of an IC that includes the amplification stage 20.

The amplification stage 20 can be used to amplify an input signal received on the input terminal IN to generate an output signal on the output terminal OUT. For example, the amplification stage 20 includes the inverting amplification block 24, which can be used to amplify the input signal by a gain factor of about −A. In one embodiment, the magnitude of the gain factor −A is selected to be in the range of about 10 to about 1000. However, persons having ordinary skill in the art will readily determine other suitable gain values.

A capacitor having a capacitance C in a signal path across an inverting gain element having a gain of −A can have an equivalent capacitance of about $C*(1+A)$ due to the Miller effect. As illustrated in FIGS. 2A and 2B, the compensation capacitor 21 is connected across the inverting amplification block 24. Accordingly, the compensation capacitor 21 can have an effective capacitance that is about equal to $C_1*(1+A)$ looking into the input of the inverting amplification block 24, where $C_1$ is the capacitance of the compensation capacitor 21.

As illustrated in FIGS. 2A and 2B, the electrical connectivity of the switchable capacitor 22 can be controlled by connecting the closed-loop gain control terminal CLG_CNTRL in different configurations. For example, in the configuration shown in FIG. 2A, the closed-loop gain control terminal CLG_CNTRL can be electrically connected to the first voltage $V_1$, which can be, for example, a DC voltage source, such as a power-low or ground supply. Additionally, in the configuration shown in FIG. 2B, the closed-loop gain control terminal CLG_CNTRL can be electrically connected to the output terminal OUT.

The closed-loop gain control terminal CLG_CNTRL can be used to control the effective capacitance of the switchable capacitor 22. For example, when the switchable capacitor 22 is connected across the input and the output of the inverting amplification block 24 as shown in FIG. 2B, the switchable capacitor 22 can have an effective capacitance about equal to $C_2*(1+A)$, where $C_2$ is the capacitance of the switchable capacitor 22. However, when the second end of the switchable capacitor 22 is electrically connected to the first voltage $V_1$ as shown in FIG. 2A, the switchable capacitor 22 can have an effective capacitance of $C_2$.

When the closed-loop gain control terminal CLG_CNTRL is connected in the configuration shown in FIG. 2A, the effective capacitance looking into the input terminal IN can be equal to about $C_1*(1+A)+C_2$, where $C_1$ and A are as defined above and where $C_2$ is about equal to the capacitance of the second capacitor 22. When the product of $C_1$ and $1+A$ is selected to be greater than $C_2$, such as a factor about 10 times greater, than the first capacitor 21 can substantially control the effective capacitance looking into the input terminal IN when the closed-loop gain control terminal CLG_CNTRL is connected as shown in FIG. 2A. However, when the closed-loop gain control terminal CLG_CNTRL is connected as shown in FIG. 2B, the effective capacitance looking into the input terminal IN can be equal to about $(C_1+C_2)*(1+A)$. Accordingly, the configuration shown in FIG. 2B can have an effective capacitance looking into the input terminal IN that is about $1+C_2/C_1$ times greater than the effective capacitance looking into the input terminal IN of the configuration shown in FIG. 2A.

As will be described in further detail below, the amplification stage 20 can be included in an amplifier to control the amplifier's unity gain crossover frequency by controlling the frequency of the amplifier's dominant pole. Since the gain of an amplifier can decrease or fall-off at frequencies beyond the dominant pole, switching the connectivity of the closed-loop gain control terminal CLG_CNTRL based on the closed-loop gain configuration that the amplifier is used in can control the unity gain crossover frequency of the amplifier.

For example, by changing the closed-loop gain control terminal CLG_CNTRL between the configuration illustrated in FIG. 2A and the configuration illustrated in FIG. 2B, the frequency of the dominant pole can be decreased by a factor of about $1+C_2/C_1$, where $C_1$ is the capacitance of the compensation capacitor 21 and $C_2$ is the capacitance of the switchable capacitor 22. By selecting $1+C_2/C_1$ to be about equal to the ratio of the closed-loop gains between the different feedback configurations of the amplifier, the amplifier can exhibit closed-loop bandwidth that is substantially independent of closed-loop gain. For example, when switching between the closed-loop configuration shown in FIG. 1A having a gain of about $1+R_2/R_1$ and the closed-loop configuration shown in FIG. 1B having a gain of about 1, the ratio of $C_2/C_1$ can be selected to be equal to the ratio of $R_2/R_1$ such that the closed-loop bandwidth of the amplifier is substantially the same between each of the closed-loop gain configurations.

Accordingly, the closed-loop gain control terminal CLG_CNTRL can be used to control the closed-loop bandwidth of an amplifier that includes the amplification stage 20. In certain implementations, the closed-loop gain control terminal CLG_CNTRL can be selectively connected by an end-user and/or during manufacture to control the closed-loop bandwidth of an amplifier. In one embodiment, the closed-loop bandwidth of the amplifier changes by less than about 20% for different configurations of closed-loop gain.

In one embodiment, an amplifier including the amplification stage 20 is configurable between a first feedback configuration having a first closed-loop gain and a second feedback configuration having a second closed-loop gain that is less than the first closed-loop gain. Additionally, the amplification stage 20 is configured to be in the configuration shown in FIG. 2A when the amplifier is in the first feedback configuration, and the amplification stage 20 is configured to be in the configuration shown in FIG. 2B when the amplifier is in the second feedback configuration. By configuring the amplifier in this manner, the amplifier can have a smaller compensation capacitor and higher dominant pole frequency in the first feedback configuration and a larger compensation capacitor and lower dominant pole frequency in the second feedback configuration.

Figure 3A:
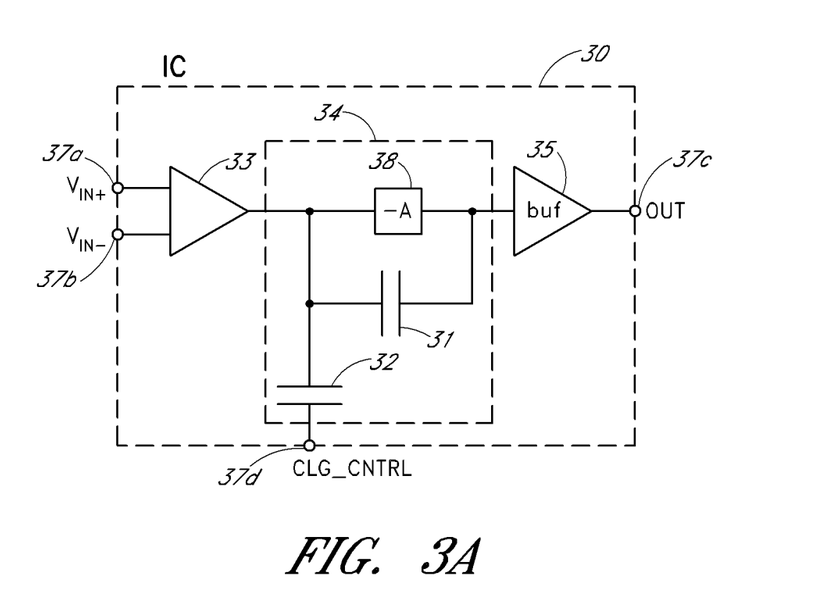
FIG. 3A is a circuit diagram of one embodiment of an integrated circuit (IC).

FIG. 3A is a circuit diagram of one embodiment of an IC 30. The IC 30 includes a first or input amplification stage 33, a second amplification stage 34, and a third or output amplification stage 35. The IC 30 further includes a first or $V_{IN+}$ pin 37a, a second or $V_{IN-}$ pin 37b, a third or OUT pin 37c, and a fourth or CLG_CNTRL pin 37d. Although the IC 30 is illustrated as including only four pins, the IC 30 can be adapted to include additional pins, including, for example, one or more power-high pins, power-low pins, control pins, and/or additional signal pins. Additionally, although not illustrated in FIG. 3A, one or more additional components, such as external resistors, can be electrically connected between the pins of the IC 30 to control, for example, closed-loop gain.

The first to third amplification stages 33-35 of the IC 30 have been configured to operate as a multi-stage amplifier. For example, the first amplification stage 33 includes a first input electrically connected to the $V_{IN+}$ pin 37a, a second input electrically connected to the $V_{IN-}$ pin 37b, and an output electrically connected to an input of the second amplification stage 34. Additionally, the third amplification stage 35 includes an input electrically connected to an output of the second amplification stage 34, and an output electrically connected to the OUT pin 37c. The first to third amplification stages 33-35 can be used to amplify a voltage difference between the $V_{IN+}$ and $V_{IN-}$ pins 37a, 37b to generate an output voltage signal on the OUT pin 37c. Cascading multiple amplifications stages in an amplifier can help achieve an overall open-loop gain. In the illustrated configuration the third amplification stage 35 is a buffer stage having a gain of about 1. Including a buffer stage in the amplifier can help reduce the output resistance of the amplifier.

As illustrated in FIG. 3A, the second amplification stage 34 includes a first or compensation capacitor 31, a second or switchable capacitor 32, and an inverting amplification block 38. The compensation capacitor 31 includes a first end electrically connected to a first end of the switchable capacitor 32, to an input of the inverting amplification block 38, and to the output of the first amplification stage 33. The compensation capacitor 31 further includes a second end electrically connected to an output of the inverting amplification block 38 and to an input of the third amplification stage 35. The switchable capacitor 32 further includes a second end electrically connected to the CLG_CNTRL pin 37d. The CLG_CNTRL pin 37d is separate from the input of the inverting amplification block 38.

In the illustrated configuration, the second amplification stage 34 can be configured to control the location of the dominant pole of the amplifier. For example, the capacitance looking into the input of the second amplification stage 34 can determine a frequency of the amplifier's dominant pole, and the CLG_CNTRL pin 37d can be connected to a DC voltage source or to the OUT pin 37c so as to control the effective capacitance looking into the input of the second amplification stage 34. By switching the CLG_CNTRL pin 37d from being connected to a DC voltage source to being connected to the OUT pin 37c, the frequency of the dominant pole can be decreased by a factor of about $1+C_2/C_1$, where $C_1$ is the capacitance of the compensation capacitor 31 and $C_2$ is the capacitance of the switchable capacitor 32. Configuring the IC 30 in this manner can help stabilize the IC 30 when using the IC 30 in feedback configurations having different closed-loop gain values.

In certain implementations, the value of $1+C_2/C_1$ can be selected to be about equal to the ratio of closed-loop gains of two feedback configurations of the amplifier. For example, when switching the IC 30 between the closed-loop configuration shown in FIG. 1A having a gain of about $1+R_2/R_1$ and the closed-loop configuration shown in FIG. 1B having a gain of about 1, the ratio of $C_2/C_1$ can is selected to be equal to the ratio of $R_2/R_1$ such that the closed-loop bandwidth of the amplifier is substantially the same between each of the closed-loop gain configurations. In one embodiment, the capacitance of the compensation capacitor 31 is selected to about equal to the capacitance of the switchable capacitor 32 such that the IC 30 can be configured to have substantially the same closed-loop bandwidth in configurations having a closed-loop gain of +1 and in configurations having a closed-loop gain of +2. However, other implementations can be used in accordance with the frequency compensation schemes described herein.

In certain implementations, the connectivity of the CLG_CNTRL pin 37d can be controlled by an end-user. Thus, the end-user can connect the CLG_CNTRL pin 37d to a DC voltage source or to the OUT pin 37c based on the closed-loop gain configuration that the IC 30 is used in. In other implementations, the connectivity of the CLG_CNTRL pin 37d can be controlled during manufacture. For example, during packaging of the IC 30, the CLG_CNTRL pin 37d can be connected using, for example, a bond wire to the OUT pin 37c or to a supply pin depending on the electronic system that the IC 30 will be used in. For example, in a Cat-5 system, the connectivity of the CLG_CNTRL pin 37d can be configured during manufacture depending on whether the IC 30 is used for amplifying signals for transmission or for receiving transmitted signals. By configuring the IC 30 to include the CLG_CNTRL pin 37d, the IC 30 can have substantially the same closed-loop bandwidth for each closed-loop gain configuration.

Figure 3B:
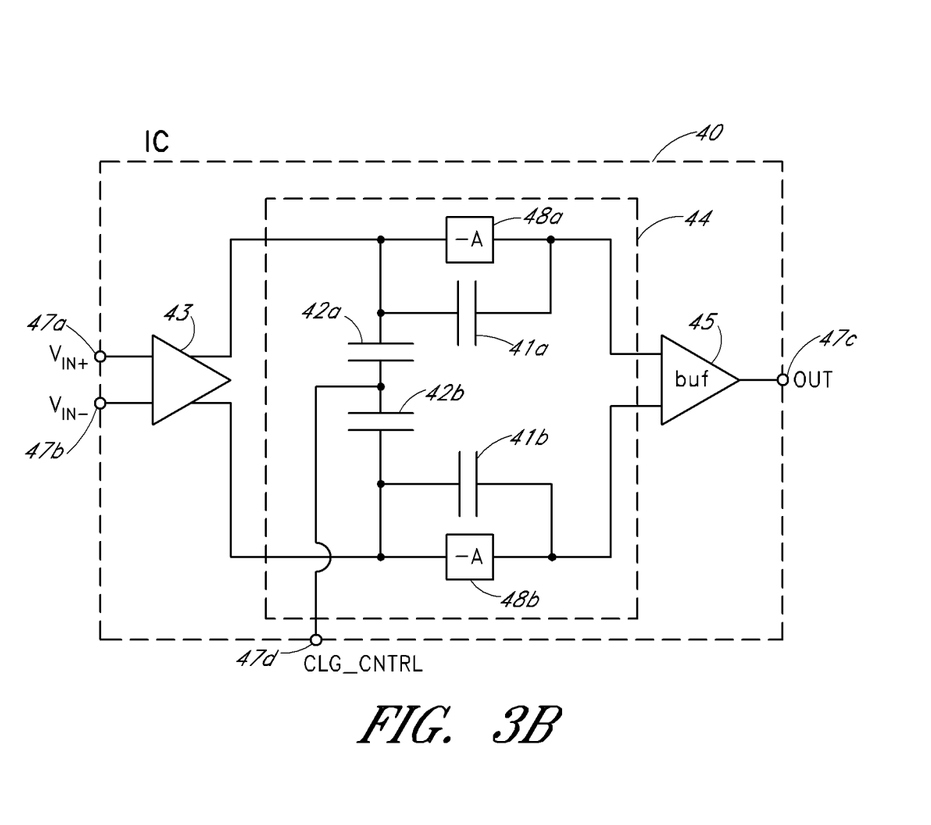
FIG. 3B is a circuit diagram of another embodiment of an IC.

FIG. 3B is a circuit diagram of another embodiment of an IC 40. The IC 40 includes a first or input amplification stage 43, a second amplification stage 44, and a third or output amplification stage 45, which collectively operate as an amplifier. The IC 40 further includes a first or $V_{IN+}$ pin 47a, a second or $V_{IN-}$ pin 47b, a third or OUT pin 47c, and a fourth or CLG_CNTRL pin 47d.

The first amplification stage 43 includes a first input electrically connected to the $V_{IN+}$ pin 47a, a second input electrically connected to the $V_{IN-}$ pin 47b, a first output electrically connected to a first input of the second amplification stage 44, and a second output electrically connected to a second input of the second amplification stage 44. Additionally, the third amplification stage 45 includes a first input electrically connected to a first output of the second amplification stage 44, a second input electrically connected to a second output of the second amplification stage 44, and an output electrically connected to the OUT pin 47c. The third amplification stage 45 can operate as a buffer that can be used to combine the differential signal between the first and second outputs of the second amplification stage 44 to generate an output signal on the OUT pin 47c.

The second amplification stage 44 includes a first inverting amplification block 48a, a second inverting amplification block 48b, a first compensation capacitor 41a, a second compensation capacitor 41b, a first switchable capacitor 42a, and a second switchable capacitor 42b. The first compensation capacitor 41a includes a first end electrically connected to a first end of the first switchable capacitor 42a, to an input of the first inverting amplification block 48a, and to the first output of the first amplification stage 43. The second compensation capacitor 41b includes a first end electrically connected to a first end of the second switchable capacitor 42b, to an input of the second inverting amplification block 48b, and to the second output of the first amplification stage 43. The first compensation capacitor 41a further includes a second end electrically connected to an output of the first inverting amplification block 48a and to the first input of the third amplification stage 45. The second compensation capacitor 41b further includes a second end electrically connected to an output of the second inverting amplification block 48b and to the second input of the third amplification stage 45. The first switchable capacitor 42a further includes a second end electrically connected to a second end of the second switchable capacitor 42b and to the CLG_CNTRL pin 47d.

The IC 40 of FIG. 3B is similar to the IC 30 of FIG. 3A, except that the IC 40 of FIG. 3B illustrates a configuration including a differential second amplification stage. The IC 40 can be used to maintain closed-loop bandwidth of the IC 40 across different closed-loop gain configurations in a manner similar to that described earlier. For example, the CLG_CNTRL pin 47d can be electrically connected to a DC voltage source such as a power-high supply or power-low supply when the amplifier is configured to have a first closed-loop gain value, and the CLG_CNTRL pin 47d can be electrically connected to the OUT pin 47c when the amplifier is configured to have a second closed-loop gain value less than the first closed-loop gain value. By configuring the IC 40 to include the CLG_CNTRL pin 47d, the IC 40 can be configured to have substantially the same closed-loop bandwidth across multiple closed-loop gain configurations.

Figure 4A:
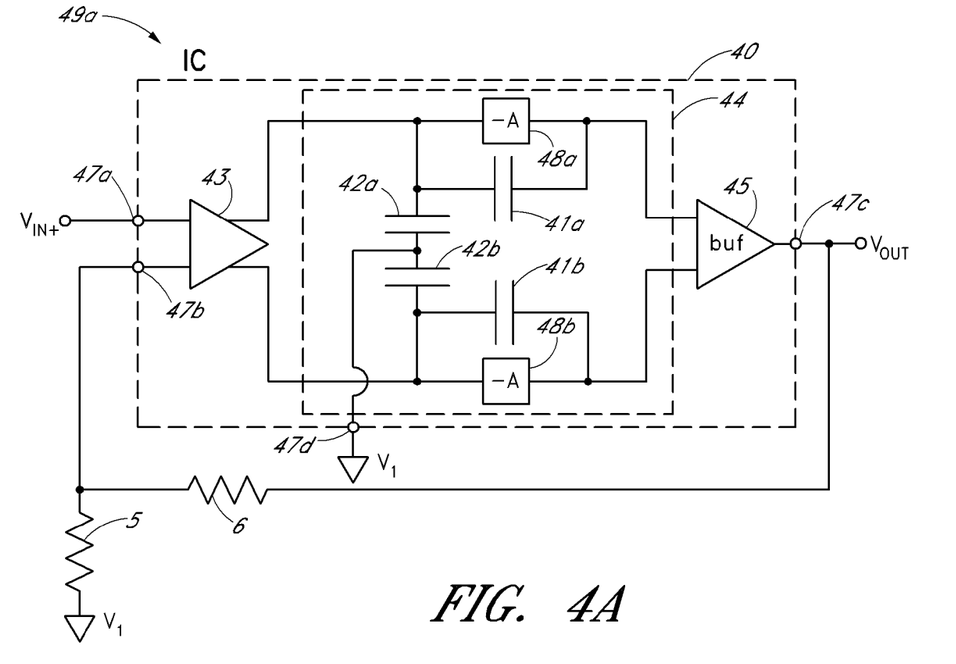
FIGS. 4A and 4B are circuit diagrams of two examples of electronic systems including the IC of FIG. 3B.
Figure 4B:
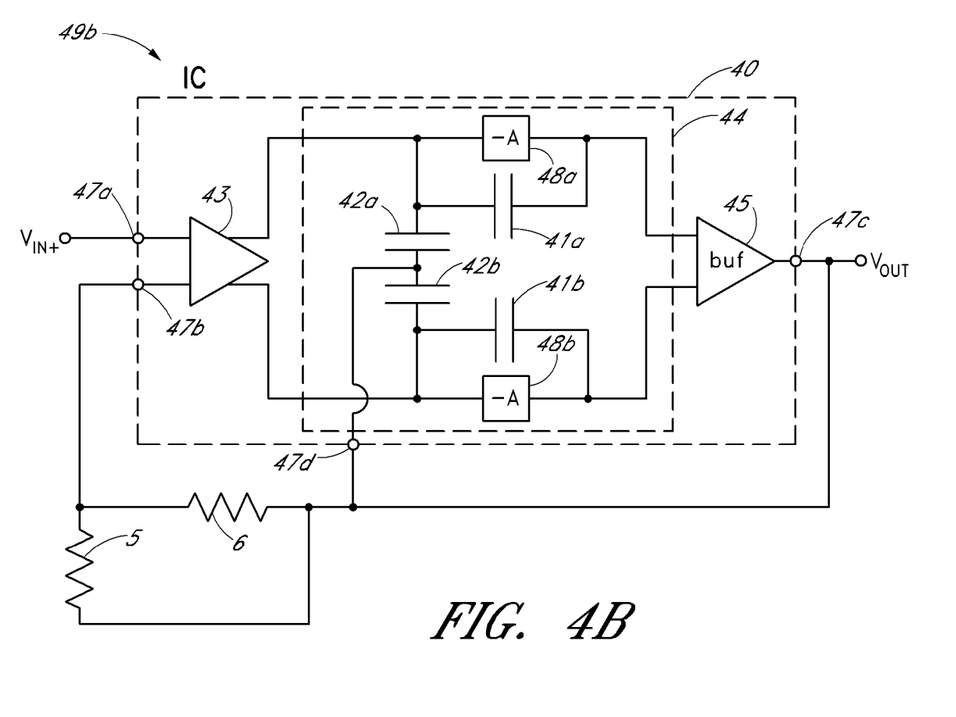

FIGS. 4A and 4B are circuit diagrams of two examples of electronic systems including the IC 40 of FIG. 3B.

FIG. 4A is a circuit diagram of a first electronic system 49a including the first resistor 5, the second resistor 6, and the IC 40. The first electronic system 49a has been electrically connected in a configuration similar to that shown in FIG. 1A. For example, the first resistor 5 has been electrically connected between the $V_{IN-}$ pin 47b and the first voltage $V_1$, and the second resistor 6 has been electrically connected between the $V_{IN-}$ pin 47b and the OUT pin 47c. As shown in FIG. 4A, the CLG_CNTRL pin 47d has been electrically connected to the first voltage $V_1$.

FIG. 4B is a circuit diagram of a second electronic system 49b including the first resistor 5, the second resistor 6, and the IC 40. The second electronic system 49b has been electrically connected in a configuration similar to that shown in FIG. 1B. For example, the first and second resistors 5, 6 have been electrically connected in parallel and disposed in a signal path between the $V_{IN-}$ pin 47b and the OUT pin 47c. As shown in FIG. 4B, the CLG_CNTRL pin 47d has been electrically connected to the OUT pin 47c.

In certain embodiments, the closed-loop gain of the amplifier embodied in the IC 40 can be controlled using external resistors electrically connected to the pins of the IC 40. To maintain closed-loop bandwidth substantially constant between these different closed-loop gain configurations, the CLG_CNTRL pin 37d can be connected in different ways. In certain implementations, the connectivity of the CLG_CNTRL pin 37d can be controlled by an end-user, while in other implementations, the connectivity of the CLG_CNTRL pin 37d can be controlled during manufacture. Although FIGS. 4A and 4B illustrate implementations that can be used to control closed-loop gain, other configurations are possible. For example, other feedback circuit components can be used. Additionally, when implementing the configuration shown in FIG. 4B, the first and second resistors 5, 6 can be omitted in favor of using a single resistor of equivalent resistance.

Figure 5:
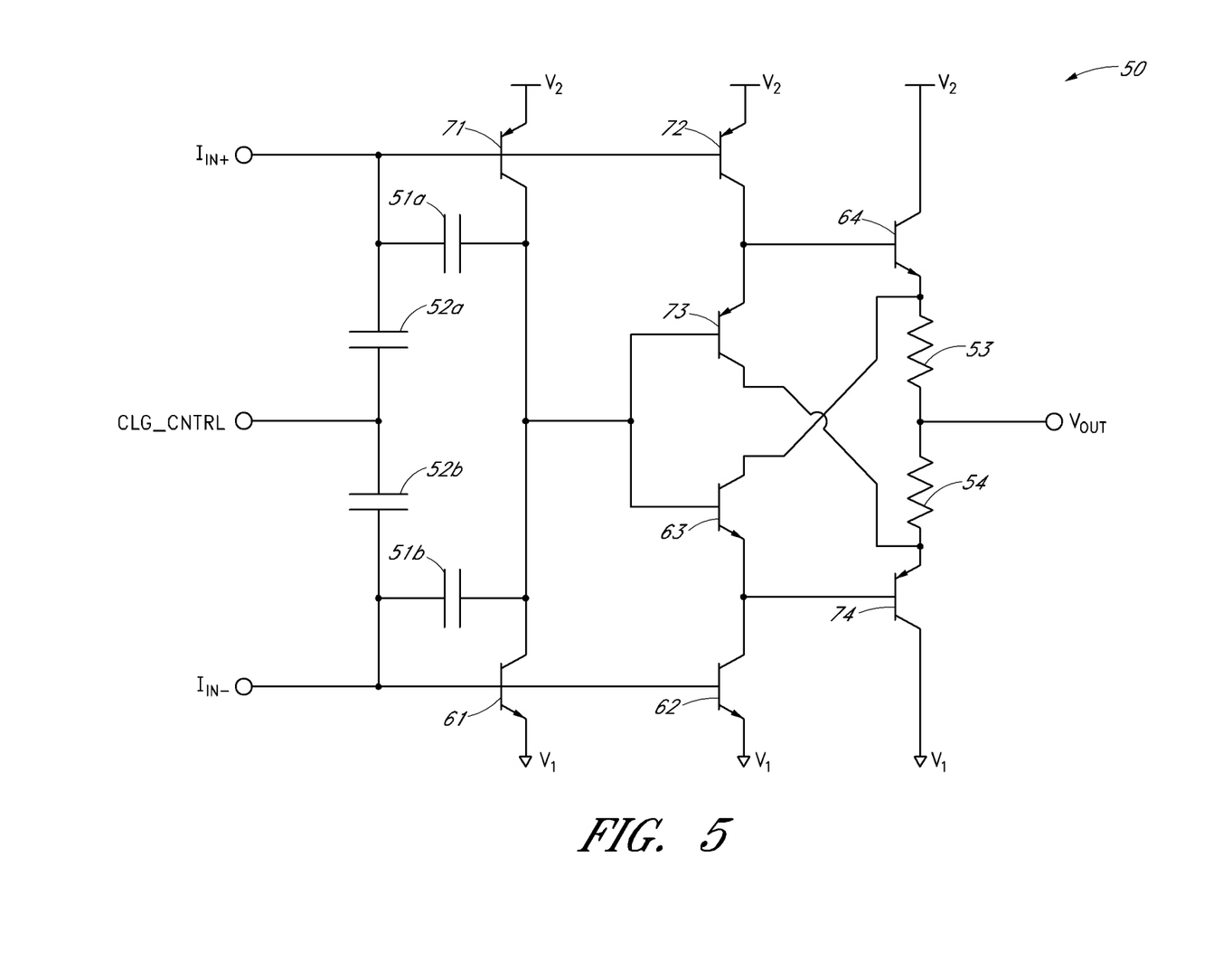
FIG. 5 is a circuit diagram of another embodiment of an amplification stage of an amplifier.

FIG. 5 is a circuit diagram of another embodiment of an amplification stage 50 of an amplifier. The amplification stage 50 includes a positive or non-inverted input current terminal $I_{IN+}$, a negative or inverted input current terminal $I_{IN-}$, an output voltage terminal $V_{OUT}$, and a closed-loop gain control terminal CLG_CNTRL. The amplification stage 50 further includes a first compensation capacitor 51a, a second compensation capacitor 51b, a first switchable capacitor 52a, a second switchable capacitor 52b, a first resistor 53, a second resistor 54, first to fourth NPN bipolar transistors 61-64, and first to fourth PNP bipolar transistors 71-74.

The first compensation capacitor 51a includes a first end electrically connected to the non-inverted input current terminal $I_{IN+}$, to a first end of the first switchable capacitor 52a, to a base of the first PNP bipolar transistor 71, and to a base of the second PNP bipolar transistor 72. The second compensation capacitor 51b includes a first end electrically connected to the inverted input current terminal $I_{IN-}$, to a first end of the second switchable capacitor 52b, to a base of the first NPN bipolar transistor 61, and to a base of the second NPN bipolar transistor 62. The first switchable capacitor 52a further includes a second end electrically connected to a second end of the second switchable capacitor 52b and to the closed-loop gain control terminal CLG_CNTRL. The first compensation capacitor 51a further includes a second end electrically connected to a second end of the second compensation capacitor 51b, to a base of the third NPN bipolar transistor 63, to a collector of the first NPN bipolar transistor 61, to a collector of the first PNP bipolar transistor 71, and to a base of the third PNP bipolar transistor 73.

The first NPN bipolar transistor 61 further includes an emitter electrically connected to a first voltage $V_1$, which can be, for example, a power-low supply. The first PNP bipolar transistor 71 further includes an emitter electrically connected to a second voltage $V_2$, which can be, for example, a power-high supply. The second NPN bipolar transistor 62 further includes an emitter electrically connected to the first voltage $V_1$ and a collector electrically connected to an emitter of the third NPN bipolar transistor 63 and to a base of the fourth PNP bipolar transistor 74. The second PNP bipolar transistor 72 further includes an emitter electrically connected to the second voltage $V_2$ and a collector electrically connected to an emitter of the third PNP bipolar transistor 73 and to a base of the fourth NPN bipolar transistor 64.

The third NPN bipolar transistor 63 further includes a collector electrically connected to an emitter of the fourth NPN bipolar transistor 64 and to a first end of the first resistor 53. The third PNP bipolar transistor 73 further includes a collector electrically connected to an emitter of the fourth PNP bipolar transistor 74 and to a first end of the second resistor 54. The fourth NPN bipolar transistor 64 further includes a collector electrically connected to the second voltage $V_2$, and the fourth PNP bipolar transistor 74 further includes a collector electrically connected to the first voltage $V_1$. The first resistor 53 further includes a second end electrically connected to a second end of the second resistor 54 and to the output voltage terminal $V_{OUT}$.

The amplification stage 50 can be used to amplify a differential input current signal received between the non-inverted and inverted input current terminals $I_{IN+}$, $I_{IN-}$ to generate an amplified voltage signal on the output voltage terminal $V_{OUT}$. For example, the first NPN bipolar transistor 61 and the first PNP bipolar transistor 71 have been configured to serve as inverting amplification stages, and the second to fourth NPN bipolar transistors 62-64 and the second to fourth PNP bipolar transistors 72-74 have been configured to operate as a unity gain buffer.

As illustrated in FIG. 5, the first and second compensation capacitors 51a, 51b have been electrically connected across the base-collector junctions of the first PNP bipolar transistor 71 and the first NPN bipolar transistor 61, respectively. The effective capacitance looking into the non-inverted and inverted input current terminals $I_{IN+}$, $I_{IN-}$ can control the location of the dominant pole of the amplifier that the amplification stage 50 is included in. Additionally, the closed-loop gain control terminal CLG_CNTRL can be selectively connected to a DC voltage source or to the output voltage terminal $V_{OUT}$ so as to control the frequency of the dominant pole. In a manner similar to that described earlier with respect to FIGS. 2A and 2B, configuring an amplification stage to include a closed-loop gain control terminal CLG_CNTRL can allow the effective capacitance looking into the non-inverted and inverted input current terminals $I_{IN+}$, $I_{IN-}$ to be selectively increased by a factor of about $1+C_2/C_1$, where $C_1$ is the capacitance of the first and second compensation capacitors 51a, 51b and $C_2$ is the capacitance of the first and second switchable capacitors 52a, 52b. By selecting $1+C_2/C_1$ to be about equal to the ratio of closed-loop gain values between closed-loop configurations of the amplifier, the amplifier can exhibit closed-loop bandwidth that is substantially independent of closed-loop gain.

In one embodiment, the amplification stage 50 is part of an IC, and the closed-loop gain control terminal CLG_CNTRL is connected to a control pad of the IC and the output voltage terminal $V_{OUT}$ is connected to an output pad of the IC. Additionally, the control pad can be connected to a DC voltage source for a first closed-loop gain configuration and the control pad can be connected to the output pad for a second closed-loop gain configuration having a lower gain than the first closed-loop gain configuration. In certain implementations, the first closed-loop gain configuration is a +2 gain configuration and the second closed-loop gain configuration is a +1 gain configuration.

Although FIG. 5 illustrates an implementation of an amplification stage using bipolar transistors to provide amplification, the teachings herein are applicable to other transistor structures. For example, the frequency compensation schemes described herein are applicable to field-effect transistor (FET) implementations.

Figure 6:
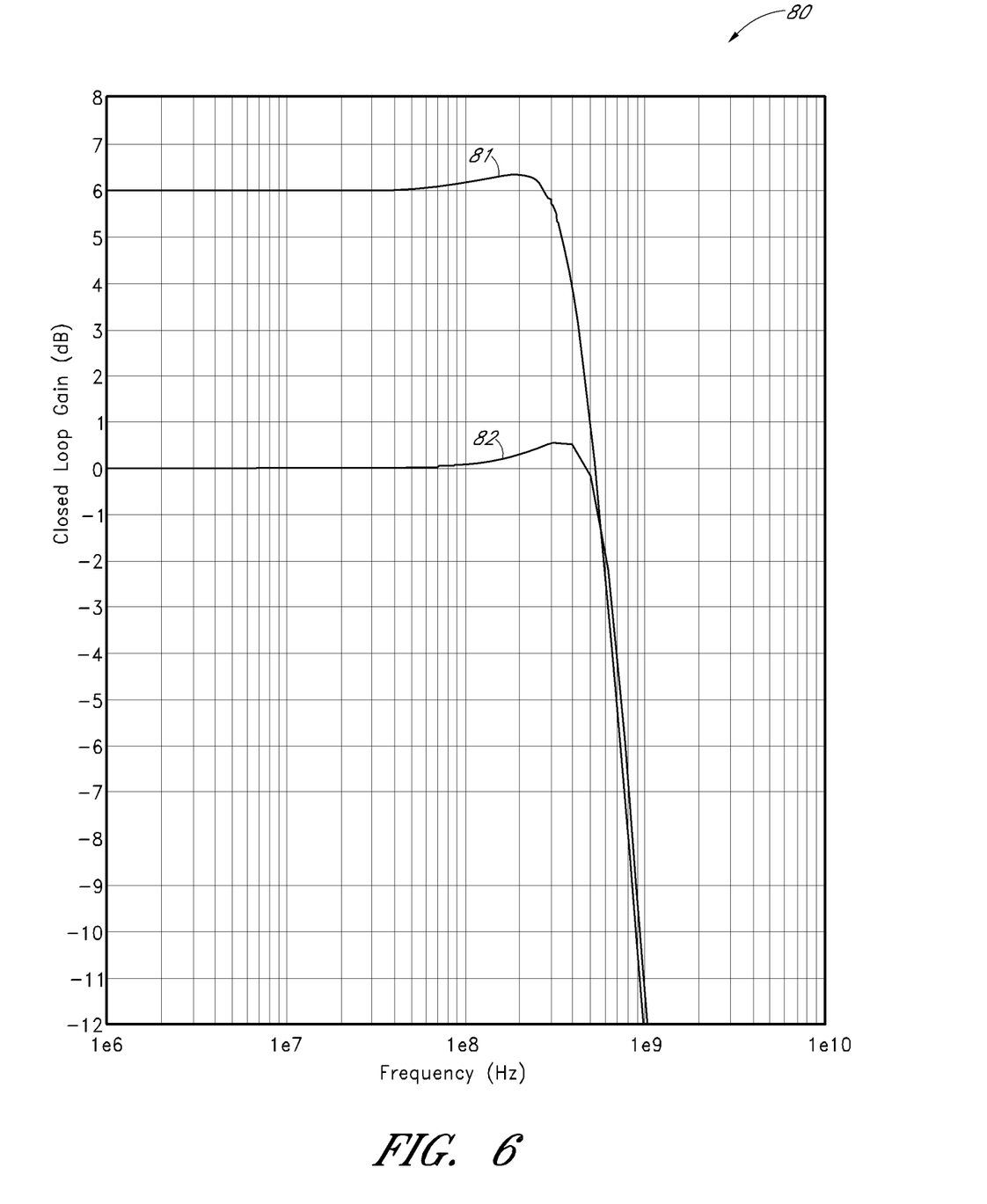
FIG. 6 is a graph of frequency versus closed-loop gain for one embodiment of an amplifier.

FIG. 6 is a graph 80 of frequency versus closed-loop gain for one embodiment of an amplifier. The graph 80 includes a first plot 81 of frequency versus closed-loop gain for a +2 gain (6 dB) configuration and a second plot 82 of frequency versus closed-loop gain for a +1 gain (0 dB) configuration. The data corresponds to simulation data obtained for an amplifier that includes one implementation of the amplification stage 50 of FIG. 6. As shown in FIG. 6, the amplifier has been configured to have a closed-loop bandwidth that is substantially constant between two different closed-loop gain configurations.

Figure 7:
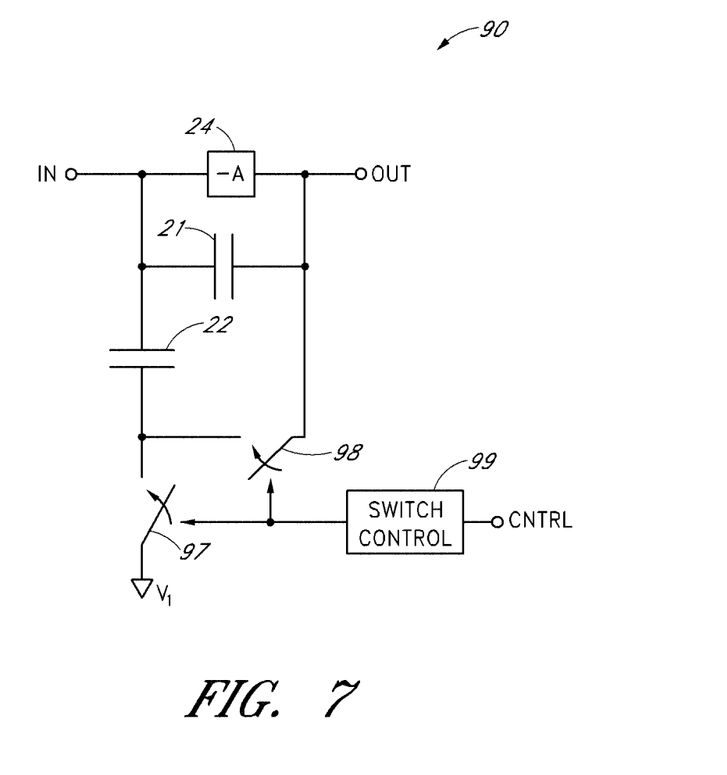
FIG. 7 is a circuit diagram of another embodiment of an amplification stage of an amplifier.

FIG. 7 is a circuit diagram of another embodiment of an amplification stage 90 of an amplifier. The amplification stage 90 includes an input terminal IN, an output terminal OUT, and a control terminal CNTRL. The amplification stage 90 further includes the compensation capacitor 21, the switchable capacitor 22, the inverting amplification block 24, a first switch 97, a second switch 98, and a switch control block 99.

The amplification stage 90 of FIG. 7 is similar to the amplification stage 20 of FIGS. 2A and 2B. However, in contrast to the amplification stage 20 of FIGS. 2A and 2B, the amplification stage 90 of FIG. 7 further includes the first and second switches 97, 98 and the switch control block 99. For example, the first switch 97 includes a control input electrically connected to a first output of the switch control block 99, a first end electrically connected to the first voltage $V_1$, and a second end electrically connected to the second end of the switchable capacitor 22 and to a first end of the second switch 98. Additionally, the second switch 98 further includes a control input electrically connected to a second output of the switch control block 99 and a second end electrically connected to the second end of the compensation capacitor 21 and to the output of the inverting amplification block 24.

The first and second switches 97, 98 and the switch control block 99 can be used to control the connectivity of the switchable capacitor 22 based on a state of the control terminal CNTRL. For example, when the control terminal CNTRL is in a first state, the switch control block 99 can be configured to close the first switch 97 and to open the second switch 98, thereby electrically connecting the second end of the switchable capacitor 22 to the first voltage $V_1$. Additionally, when the control terminal CNTRL is in a second state, the switch control block 99 can be configured to open the first switch 97 and to close the second switch 98, thereby electrically connecting the second end of the switchable capacitor 22 to the output of the inverting amplification block 24.

The amplification stage 90 can be used in a variety of applications, including, for example, in implementations in which digital control of the connectivity of switchable capacitor 22 is desired and/or in implementations in which the second end of the switchable capacitor 22 is not electrically connected to a dedicated pin or pad. Although FIG. 7 illustrates one example of an implementation including switches and a switch control block, other implementations are possible. For example, in one embodiment, a buffer is disposed in a signal path between the output of the inverting amplification block 24 and the output terminal OUT, and the second end of the second switch 98 is electrically connected to the output of the buffer rather than to the output of the inverting amplification block 24.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, medical electronic products, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. The medical electronic products can include, but are not limited to, a Digital-X-ray detector, a CT (Computed Tomography) scanner, an Ultrasounds system, a MRI (Magnetic Resonance Imaging) system, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit (IC), comprising:
   an amplifier configured to amplify an input signal to generate an output signal, wherein the amplifier comprises a first inverting amplification block;
   a first compensation capacitor electrically connected between an input of the first inverting amplification block and an output of the first inverting amplification block;

an output pad configured to receive the output signal from the amplifier;

a control pad configured to control a closed-loop bandwidth of the amplifier, wherein the control pad is separate from the input of the first inverting amplification block; and a first switchable capacitor electrically connected between the input of the first inverting amplification block and the control pad, wherein the first switchable capacitor is an explicit capacitor, wherein the amplifier is configurable between a first feedback configuration having a first closed-loop gain and a second feedback configuration having a second closed-loop gain that is less than the first closed-loop gain, and wherein the control pad is electrically connected to a DC voltage source when the amplifier is in the first feedback configuration, and wherein the control pad is electrically connected to the output pad when the amplifier is in the second feedback configuration to provide frequency compensation to the amplifier by increasing an effective capacitance of the first switchable capacitor, and wherein the amplifier is configurable between the first feedback configuration and the second feedback configuration using a first external resistor and a second external resistor.

2. The IC of claim 1, wherein the control pad is configured to maintain the closed-loop bandwidth of the amplifier substantially constant between the first and second feedback configurations by decreasing a frequency of a dominant pole of the amplifier by a factor about equal to a ratio of the first closed-loop gain to the second closed-loop gain.

3. The IC of claim 1, wherein the IC further includes an input pad, wherein the first external resistor includes a first end electrically connected to the input pad, and wherein the second external resistor includes a first end electrically connected to the input pad and a second end electrically connected to the output pad.

4. The IC of claim 3, wherein the second end of the first external resistor is electrically connected to the DC voltage source when the amplifier is in the first feedback configuration, and wherein the second end of the first external resistor is electrically connected to the output of the amplifier when the amplifier is in the second feedback configuration.

5. The IC of claim 1, wherein the amplifier is configurable between the first feedback configuration and the second feedback configuration such that an amount of effective compensation capacitance provided by connection of the control pad to the output pad varies simultaneously with a change in closed-loop gain.

6. The IC of claim 1, wherein the first switchable capacitor has a capacitance about equal to a capacitance of the first compensation capacitor.

7. The IC of claim 6, wherein the electrical connectivity of the control pad can be controlled to maintain the closed-loop bandwidth of the amplifier substantially constant between a first feedback configuration of the amplifier having a gain of about 2 and a second feedback configuration of the amplifier having a gain of about 1.

8. The IC of claim 1, wherein the IC further includes a first input pad and a second input pad, and wherein the input signal of the amplifier is a differential input signal received between the first and second input pads.

9. The IC of claim 1, wherein the amplifier further comprises an input amplification stage having a first input electrically connected to the first input pad, a second input electrically connected to the second input pad, and a first output electrically connected to the input of the first inverting amplification block.

10. An integrated circuit (IC), comprising:
an amplifier configured to amplify an input signal to generate an output signal, wherein the amplifier comprises a first inverting amplification block;
a first compensation capacitor electrically connected between an input of the first inverting amplification block and an output of the first inverting amplification block;
an output pad configured to receive the output signal from the amplifier;
a control pad configured to control a closed-loop bandwidth of the amplifier, wherein the control pad is separate from the input of the first inverting amplification block; and
a first switchable capacitor electrically connected between the input of the first inverting amplification block and the control pad, wherein the first switchable capacitor is an explicit capacitor,
wherein the amplifier further comprises a second inverting amplification block and the IC further comprises a second compensation capacitor and a second switchable capacitor, wherein the second compensation capacitor is electrically connected between an input of the second inverting amplification block and an output of the second inverting amplification block, and wherein the second switchable capacitor is electrically connected between the input of the second inverting amplification block and the control pad.

11. The IC of claim 10, wherein the first inverting amplification block comprises a PNP bipolar transistor and the second inverting amplification block comprises an NPN bipolar transistor.

12. An integrated circuit (IC), comprising:
an amplifier configured to amplify an input signal to generate an output signal, wherein the amplifier comprises a first inverting amplification block;
a first compensation capacitor electrically connected between an input of the first inverting amplification block and an output of the first inverting amplification block;
an output pad configured to receive the output signal from the amplifier;
a control pad configured to control a closed-loop bandwidth of the amplifier, wherein the control pad is separate from the input of the first inverting amplification block; and
a first switchable capacitor electrically connected between the input of the first inverting amplification block and the control pad, wherein the first switchable capacitor is an explicit capacitor,
wherein the amplifier further comprises a buffer stage having an input electrically connected to the output of the first inverting amplification block and an output electrically connected to the output pad.

13. An amplifier, comprising:
an inverting amplification block;
a compensation capacitor including a first end connected to an input of the inverting amplification block and a second end electrically connected to an output of the inverting amplification block;
a switchable capacitor including a first end electrically connected to the input of the inverting amplification block and a second end, wherein the switchable capacitor is an explicit capacitor;

a plurality of switches electrically connected to the second end of the switchable capacitor;

a switch control block configured to control the plurality of switches based on a control signal, wherein the switch control block is configured to electrically connect the second end of the switchable capacitor to a DC voltage source when the control signal is in a first state, and wherein the switch control block is configured to electrically connect the second end of the switchable capacitor to an output of the inverting amplification block when the control signal is in a second state, wherein the control signal is configured to be in the first state when the amplifier is in a first feedback configuration having a first closed-loop gain, and wherein the control signal is configured to be in the second state when the amplifier is in a second feedback configuration having a second closed-loop gain that is less than the first closed-loop gain; and a first resistor and a second resistor configured to control the closed-loop gain of the amplifier, wherein the first resistor includes a first end electrically connected to an input of the amplifier, and wherein the second resistor includes a first end electrically connected to the input of the amplifier and a second end electrically connected to an output of the amplifier.

14. The amplifier of claim 13, wherein the switch control block is configured to maintain the closed-loop bandwidth of the amplifier substantially constant between the first and second feedback configurations by decreasing a frequency of a dominant pole of the amplifier by a factor about equal to a ratio of the first closed-loop gain to the second closed-loop gain.

15. The amplifier of claim 13, wherein the second end of the first resistor is electrically connected to the DC voltage source when the amplifier is in the first feedback configuration, and wherein the second end of the first resistor is electrically connected to the output of the amplifier when the amplifier is in the second feedback configuration.

16. The amplifier of claim 13, wherein the amplifier is configurable between the first feedback configuration and the second feedback configuration such that an amount of effective compensation capacitance provided by connection of the switchable capacitor to the output of the inverting amplification block varies simultaneously with a change in closed-loop gain.

* * * * *

UNITED STATES PATENT AND TRADEMARK OFFICE
CERTIFICATE OF CORRECTION

| | | |
|---|---|---|
| PATENT NO. | : 8,766,725 B2 | Page 1 of 1 |
| APPLICATION NO. | : 13/446773 | |
| DATED | : July 1, 2014 | |
| INVENTOR(S) | : Stefano I. D'Aquino et al. | |

It is certified that error appears in the above-identified patent and that said Letters Patent is hereby corrected as shown below:

In the Claims

In column 13 at line 65, in claim 9, change "claim 1," to --claim 8,--.

Signed and Sealed this
Fourteenth Day of April, 2015

Michelle K. Lee
*Director of the United States Patent and Trademark Office*